United States Patent
Wu et al.

(10) Patent No.: US 6,179,632 B1
(45) Date of Patent: Jan. 30, 2001

(54) ELECTRICAL CONNECTOR

(75) Inventors: Ming-Chuan Wu, Sun-Lin; Da-Ching Lee, Tu-Chen, both of (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/421,756

(22) Filed: Oct. 19, 1999

(30) Foreign Application Priority Data

May 6, 1999 (TW) .................................................. 88207171

(51) Int. Cl.⁷ ...................................................... H01R 4/02
(52) U.S. Cl. ............................................... 439/83; 439/660
(58) Field of Search .............................. 439/83, 660, 876

(56) References Cited

U.S. PATENT DOCUMENTS

| | | | |
|---|---|---|---|
| 5,667,393 | * 9/1997 | Grabbe et al. | 439/83 |
| 5,681,174 | * 10/1997 | Correll, Jr. et al. | 439/135 |
| 5,697,799 | * 12/1997 | Consoli et al. | 439/181 |
| 5,902,136 | * 5/1999 | Lemke et al. | 439/660 |
| 5,961,347 | * 10/1999 | Hsu | 439/83 |
| 5,971,809 | * 10/1999 | Ho | 439/660 |

* cited by examiner

*Primary Examiner*—Gary F. Paumen
(74) *Attorney, Agent, or Firm*—Wei Te Chung

(57) ABSTRACT

An electrical connector comprises a housing and a number of contacts received in the housing. The housing includes a pair of elongate side walls and a mating board disposed between the side walls. A number of ribs laterally extends from opposite inner surfaces of the side walls toward the mating board thereby increasing the rigidity of the side walls. The mating board forms a plurality of lateral passageways in opposite surfaces thereof exposed to the side walls. Each contact includes a mating portion, a fixing portion extending from the mating portion, a slanted portion extending from the fixing portion for preventing molten solder from wicking, and a soldering portion extending from the slanted portion and perpendicular to the fixing portion. The fixing portions are securely received in the corresponding passageways of the housing.

1 Claim, 6 Drawing Sheets

ELECTRICAL CONNECTOR

FIELD OF THE INVENTION

The present invention relates to an electrical connector, and particularly to an electrical connector having a plurality of contacts which prevent wicking of molten solder during a wave soldering procedure.

BACKGROUND OF THE INVENTION

A board to board electrical connector is often surface mounted on a printed circuit board by soldering. Pertinent examples are disclosed in U.S. Pat. Nos. 5,681,174 and 5,697,799 and in Taiwan patent application Nos. 84105863, 85103740, 85103743 and 86202873.

Referring to FIG. 6, a conventional electrical connector 100 comprises an elongate housing 102 and a plurality of contacts 104 received in the housing 102. The housing 102 includes two opposite thin sidewalls 105. Each contact includes a fixing portion 106, a mating portion 108 upwardly extending from an end of the fixing portion 106 and a soldering portion 110 perpendicularly extending from an opposite end of the fixing portion 106 for being surface mounted on a printed circuit board 112.

However, since the soldering portion 110 perpendicularly extends from the fixing portion 106, during the soldering procedure, molten solder easily wicks toward the fixing portion 106 thereby adversely affecting reliability of the solder connection. Furthermore, since each side wall 105 of the housing 102 is elongate and thin, during an ejection molding procedure and the soldering procedure, the side wall 105 is easily deformed as exposed to high temperature gradient.

SUMMARY OF THE INVENTION

Accordingly, an object of the present invention is to provide an electrical connector with rigid housing structure.

Another object of the present invention is to provide an electrical connector which prevents the solder from being wicked to the fixing portion of the terminal thereby reducing the malfunction of the connector.

To achieve the objects mentioned above, an electrical connector comprises a housing and a plurality of contacts received in the housing. The housing includes a pair of elongate side walls and a mating board disposed between the side walls. A plurality of ribs laterally extends from opposite inner surfaces of the side walls toward the mating board thereby increasing the rigidity of the side walls. The mating board forms a plurality of lateral passageways in opposite surfaces thereof exposed to the side walls. Each contact includes a mating portion, a fixing portion extending from the mating portion, a slanted portion extending from the fixing portion for preventing molten solder from wicking, and a soldering portion extending from the slanted portion and perpendicular to the fixing portion. The fixing portions are securely received in the corresponding passageways of the housing.

Other objects can be easily drawn from the following description.

DETAILED DESCRIPTION OF THE INVENTION

Figure 1:
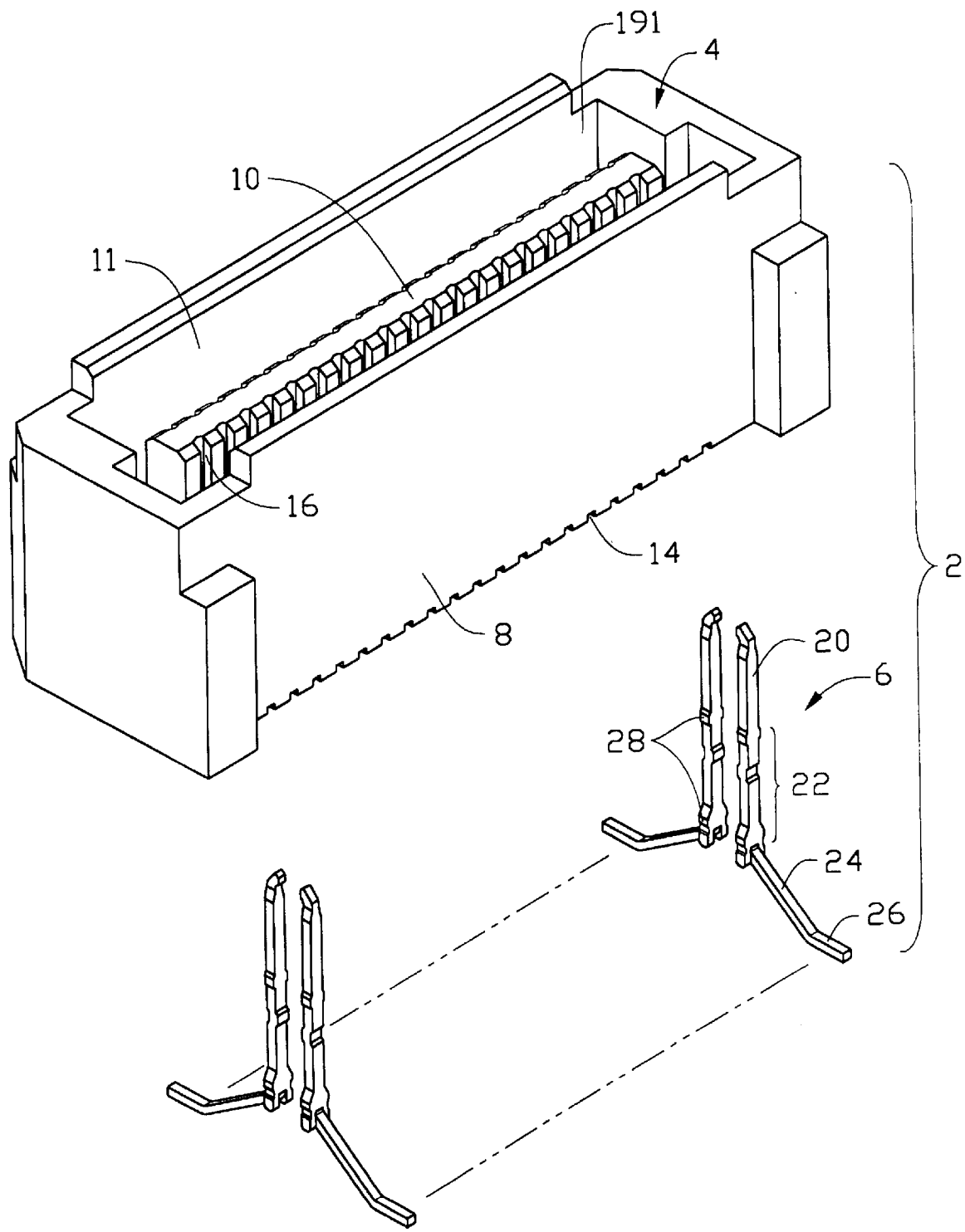
FIG. 1 is an exploded view of an electrical connector embodying the concepts of the present invention.
Figure 2:
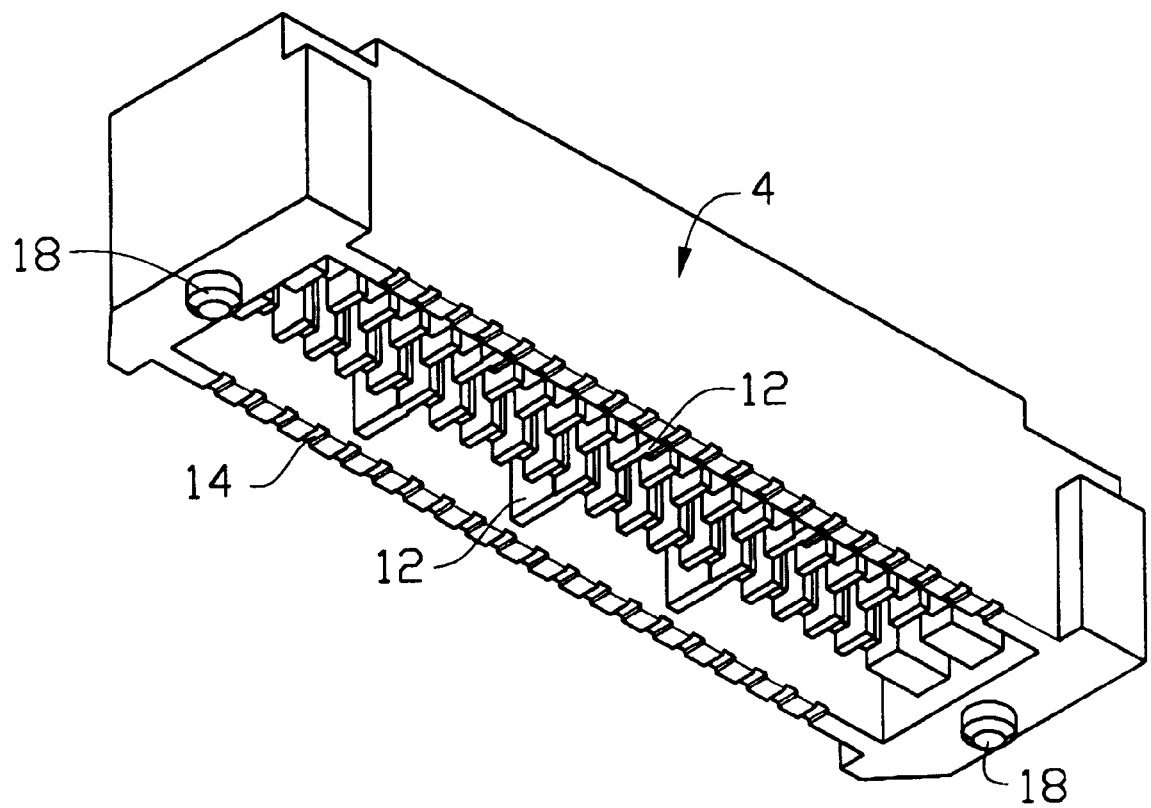
FIG. 2 is a perspective view of a housing of the present invention.

Referring to FIGS. 1 and 2, an electrical connector 2 embodying the concepts of the present invention comprises a housing 4 and a plurality of contacts 6 received in the housing 4. The housing 4 includes a pair of elongate side walls 8 and a mating board 10 disposed between the side walls 8. The elongate side walls 8 and the mating board 10 together define, through a divider wall 27, an upper and a lower receiving spaces 191, 192 respectively opposed to a front mating surface and bottom surface of the housing 4. A plurality of ribs 12 laterally extends from opposing inner surface of the side walls 8 toward the mating board 10 thereby increasing the rigidity of the side walls 8. Each side wall 8 forms a plurality of lateral slots 14 in a bottom surface thereof. The mating board 10 forms a plurality of lateral passageways 16 in opposite surfaces thereof facing the side walls 8 and aligned with the corresponding slots 14. A pair of posts 18 extends from a bottom surface of the housing 4.

Each contact 6 includes a mating portion 20, a fixing portion 22 extending from the mating portion 20, a slanted portion 24 extending at an incline from the fixing portion 22, and a soldering portion 26 extending from the slanted portion 24 and perpendicular to the fixing portion 22. The fixing portion 22 forms two pairs of fixing protrusions 28 on opposite sides thereof for being interferentially received in the passageways 16 of the housing 4.

Figure 3:
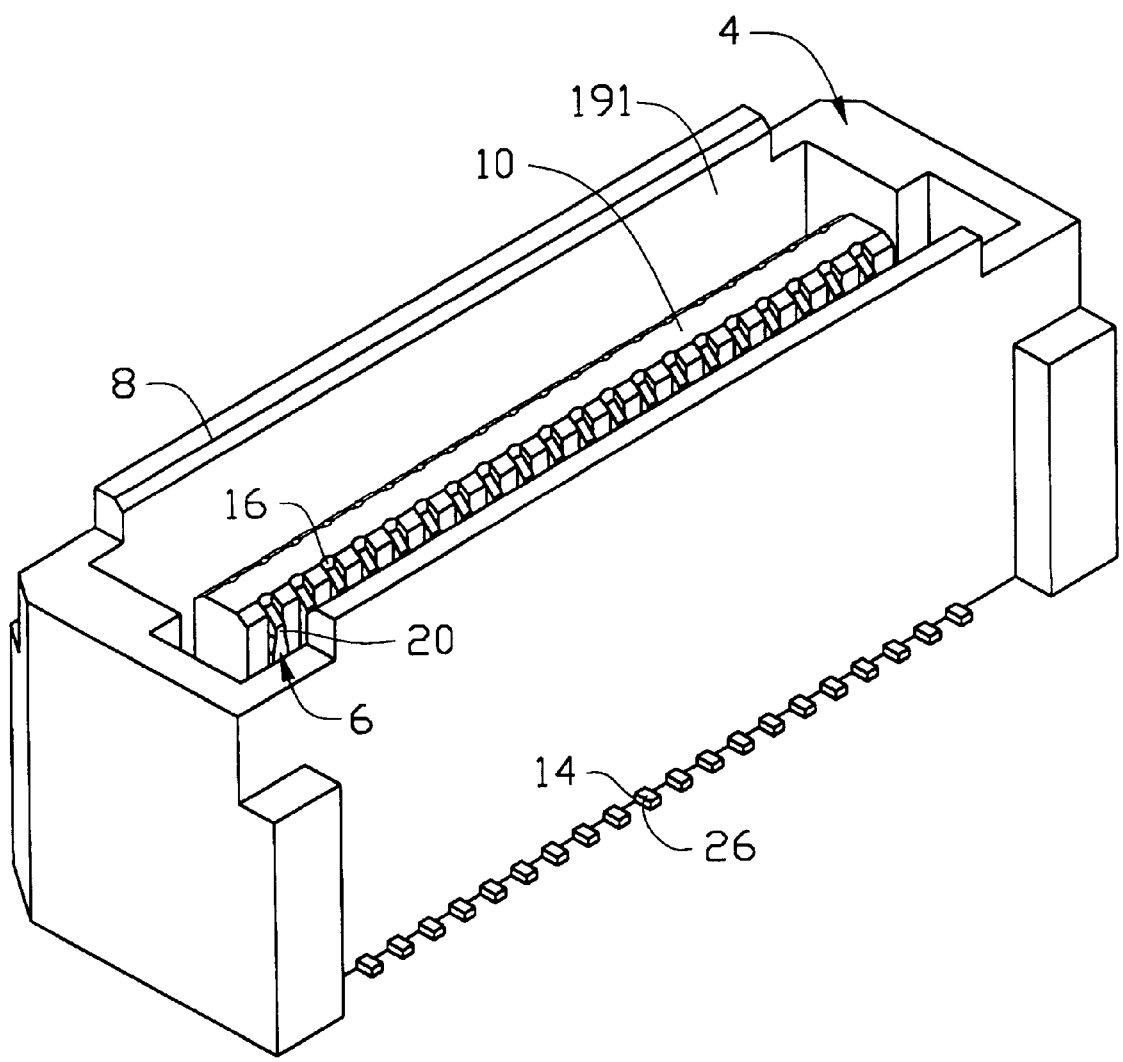
FIG. 3 is an assembled view of FIG. 1.
Figure 4:
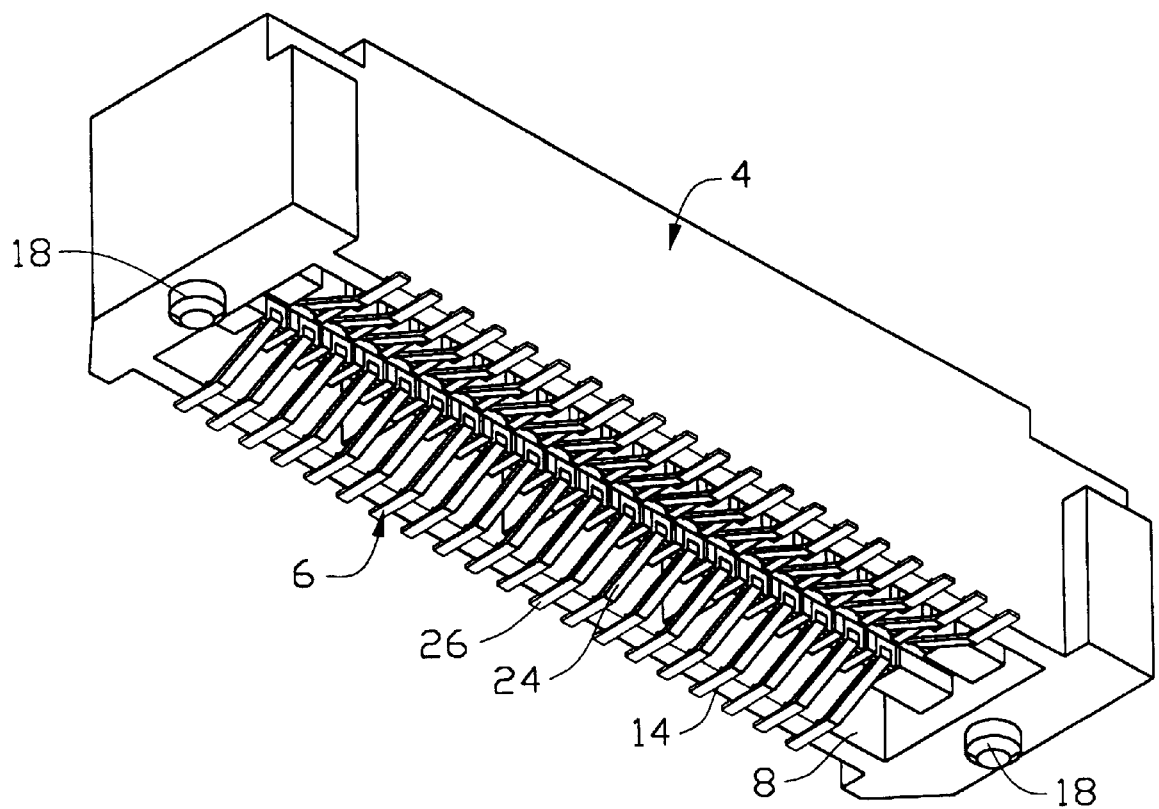
FIG. 4 is similar to FIG. 3 but taken from another perspective.
Figure 5:
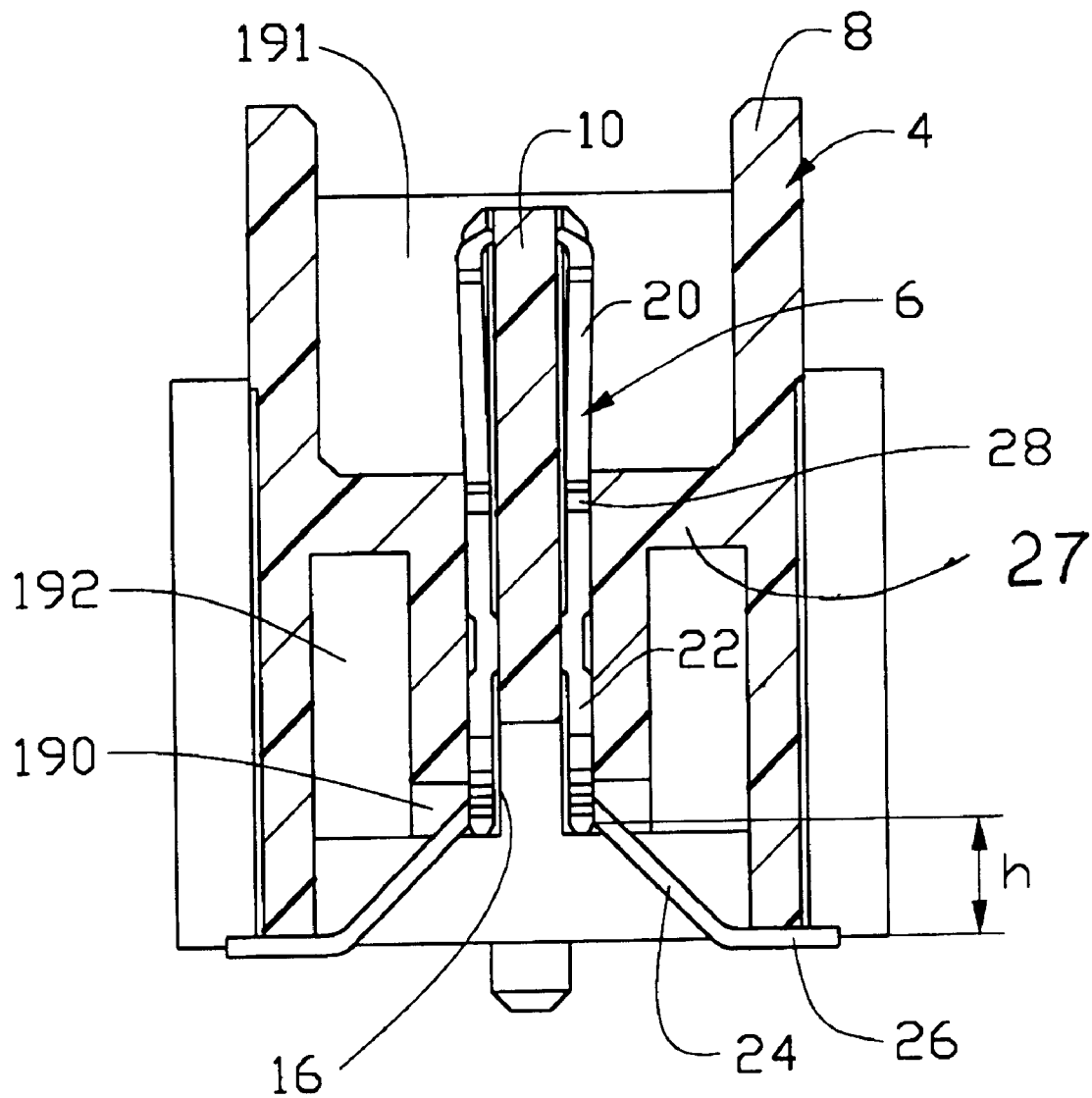
FIG. 5 is a cross sectional view of FIG. 3.
Figure 6:
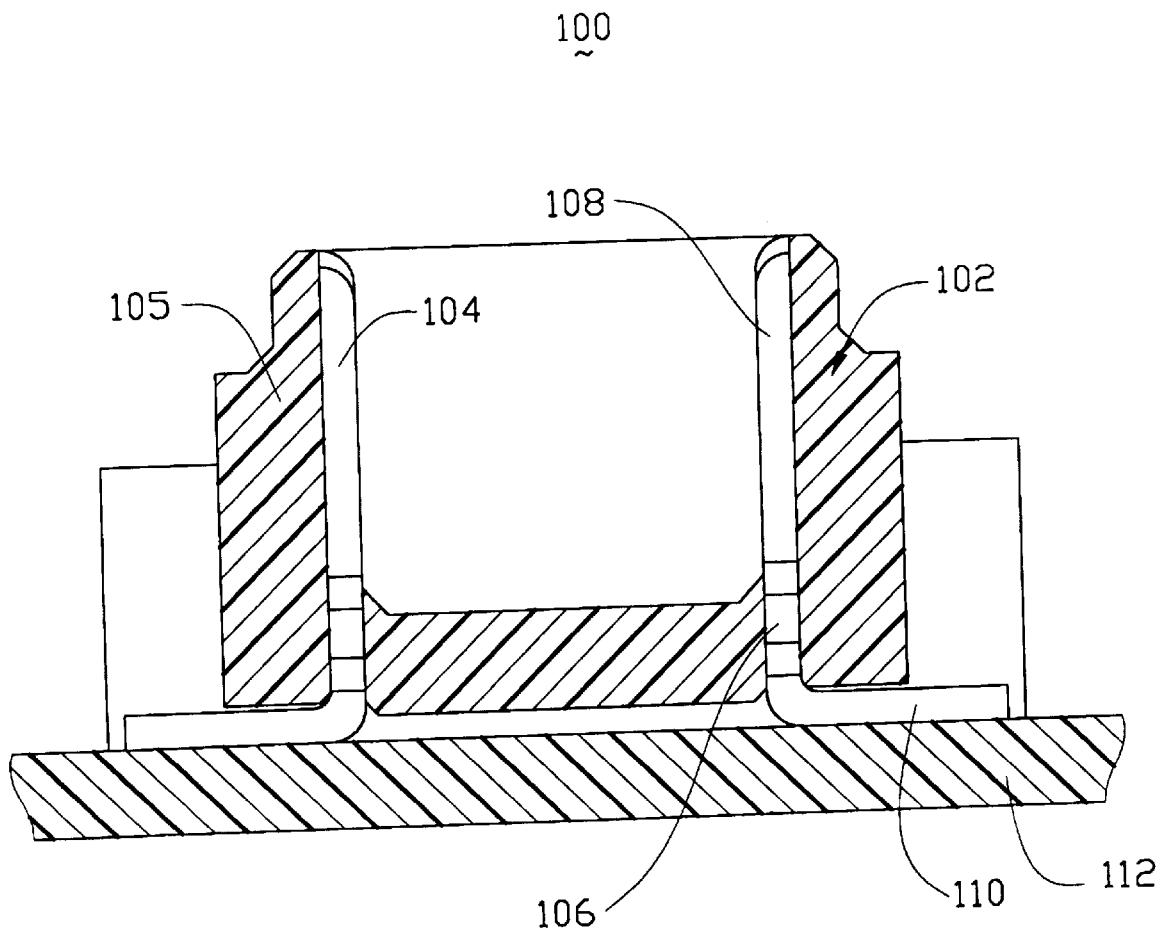
FIG. 6 is a cross sectional view of a conventional electrical connector.

Referring to FIG. 3–5, in assembly, the mating portions 20 and the fixing portions 22 of the contacts 6 are securely received in the corresponding passageways 16 of the mating board 10. The soldering portions 26 extend through the slots 14 of the side walls 8 of the housing 4 to ensure proper positioning thereof before being mounted on a printed circuit board (not shown). The slanted portion 24 is disposed between the fixing portion 22 and the soldering portion 26, and the fixing portion 22 is distanced from the soldering portion 26 a vertical distance h. Thus, molten solder is not easily wicked upward along the slanted portion 24 during a wave soldering procedure. Furthermore, the lower receiving space 192 defines a recessed space 190 for receiving the slanted portion 24 therein, thus, the length of the contact 6 can be reduced while the rigidity of the contact 6 is improved.

The electrical connector of the present invention and many of its attendant advantages is understood from the foregoing description. It is apparent that various changes may be made in the form, construction, and arrangement of parts thereof without departing from the spirit or scope of the invention, or sacrificing the material advantages thereof.

What is claimed is:

1. An electrical connector comprising:

a housing including a pair of elongate side walls and a mating board disposed between the side walls, the elongate side walls and the mating board together defining an upper and lower receiving spaces respectively opposed to a top surface and a bottom surface of the housing, a plurality of ribs laterally extending from opposite inner surfaces of the side walls toward the mating board thereby increasing the rigidity of the side walls, the mating board forming a plurality of passageways in opposite surfaces thereof facing the side walls; and a plurality of contacts received in the housing, each contact including:

a mating portion;

a fixing portion extending from the mating portion and securely received in a corresponding passageway of the mating board;

a slanted portion angularly extending downward from the fixing portion into the lower receiving space to prevent molten solder from wicking upward therealong; and a soldering portion extending from the slanted portion to solder to a circuit board, wherein the lower receiving space defines a recess for receiving the slanted portion of each contact therein;

wherein the slanted portion of each contact is slantwise disposed between the fixing portion and the soldering portion;

wherein the fixing portion is distanced a vertical height from the soldering portion;

wherein the fixing portion forms a plurality of fixing protrusions on opposite edges thereof for securely engaging with a corresponding passageway;

wherein each side wall forms a plurality of lateral slots in a bottom edge thereof, and wherein the soldering portions extend through the slots of the side walls to be secured therein.

* * * * *